(12) United States Patent
Kim et al.

(10) Patent No.: US 6,603,356 B1
(45) Date of Patent: Aug. 5, 2003

(54) METHOD AND CIRCUIT FOR CONTROLLING QUIESCENT CURRENT OF AMPLIFIER

(75) Inventors: Chun-Sup Kim, San Jose, CA (US); Ara Bicakci, San Jose, CA (US); Sang-Soo Lee, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/047,960

(22) Filed: Jan. 14, 2002

Related U.S. Application Data
(60) Provisional application No. 60/338,811, filed on Dec. 7, 2001.

(51) Int. Cl.[7] .............................................. H03F 3/26
(52) U.S. Cl. ........................... 330/265; 330/267; 330/2
(58) Field of Search ........................ 330/2, 9, 51, 255, 330/264, 265, 267

(56) References Cited

U.S. PATENT DOCUMENTS

| | | | | |
|---|---|---|---|---|
| 4,963,837 A | * | 10/1990 | Dedic | 330/264 |
| 5,162,753 A | * | 11/1992 | Khorramabadi | 330/264 |
| 6,255,909 B1 | * | 7/2001 | Muza | 330/264 |

OTHER PUBLICATIONS

Casier et al., "A 3.3–V, Low–Distortion ISDN Line Driver with a Novel Quiescent Current Control Circuit", Jul., 1998, IEEE Journal of Solid–State Circuits, vol. 33, No. 7.

Khorramabadi, Haideh, "A CMOS Line Driver with 80–dB Linearity for ISDN Applications", Apr. 1992, IEEE Journal of Solid–State Circuits, vol. 27, No. 4.

Khorramabadi et al., "A Highly Efficient CMOS Line Driver with 80–dB Linearity for ISDN U–Interface Applications", Dec. 1992, IEEE Journal of Solid–State Circuits, vol. 27, No. 12.

* cited by examiner

Primary Examiner—Steven J. Mottola
(74) Attorney, Agent, or Firm—Thelen Reid & Priest LLP

(57) ABSTRACT

A method and circuit control a quiescent current of an amplifier including a preamplifier, error amplifiers, and output devices driven by the error amplifiers, the error amplifiers having an input-referred offset voltage. The method includes (a) applying a calibration voltage to an input of the error amplifiers, (b) calibrating a quiescent current of the output devices by changing the calibration voltage so that the calibrated quiescent current has a predetermined current value, the calibration voltage corresponding to the calibrated quiescent current being set as a correction voltage, and (c) operating the amplifier with the correction voltage applied to the input of the error amplifiers. The circuit includes a correction voltage generator supplying a correction voltage to the error amplifier input, a quiescent current detector detecting the quiescent current, and a calibration circuit adjusting the correction voltage so that the quiescent current is calibrated to a predetermined current value.

40 Claims, 10 Drawing Sheets

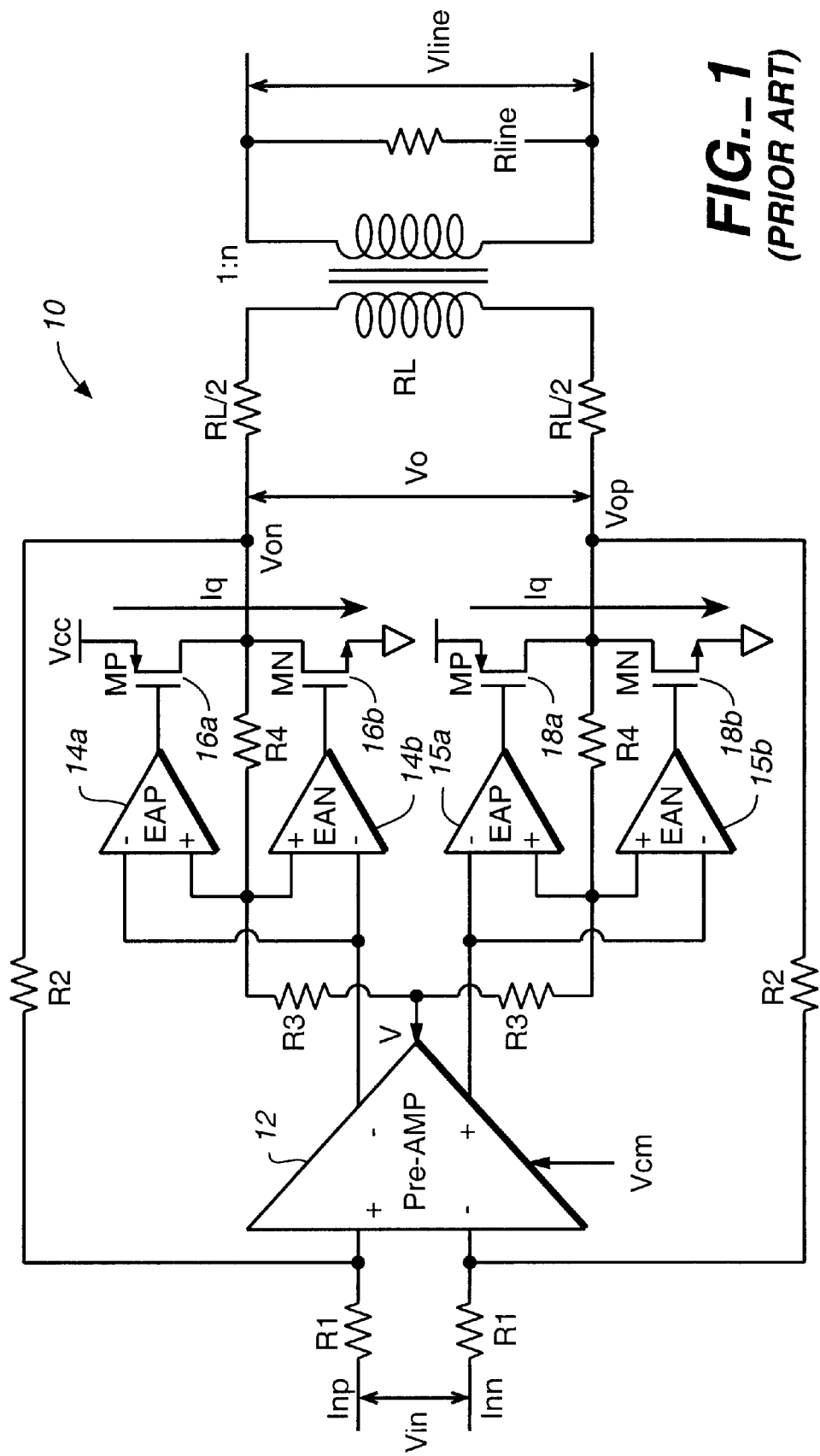
FIG._1 (PRIOR ART)

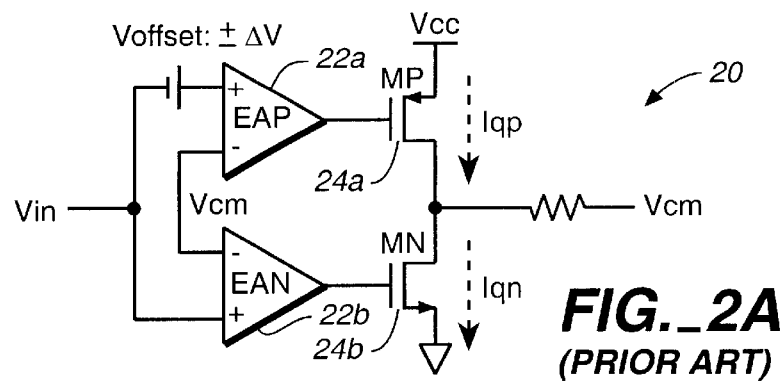
*FIG._2A*
*(PRIOR ART)*
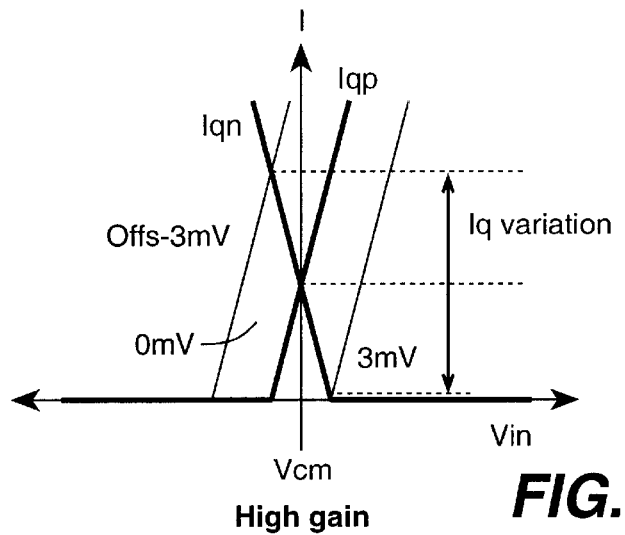
*FIG._2B*
*(PRIOR ART)*
High gain
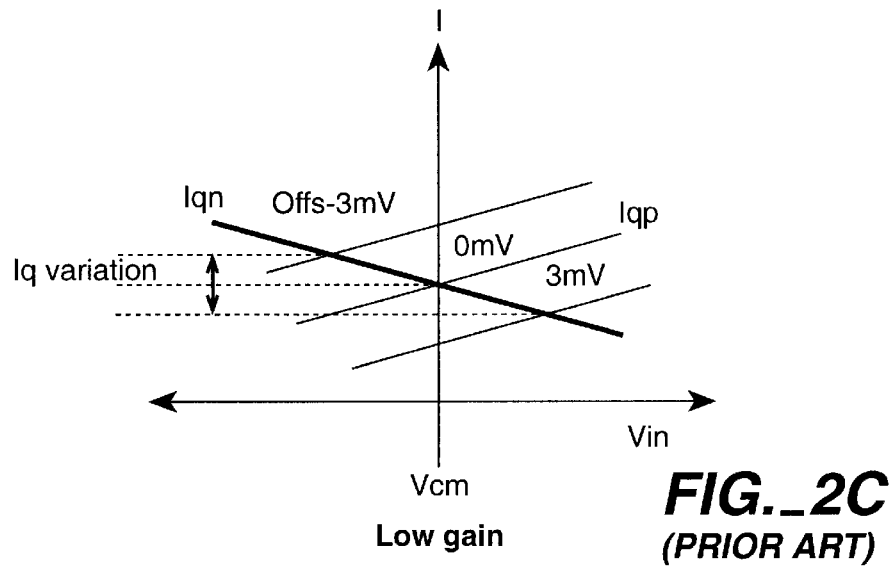
*FIG._2C*
*(PRIOR ART)*
Low gain

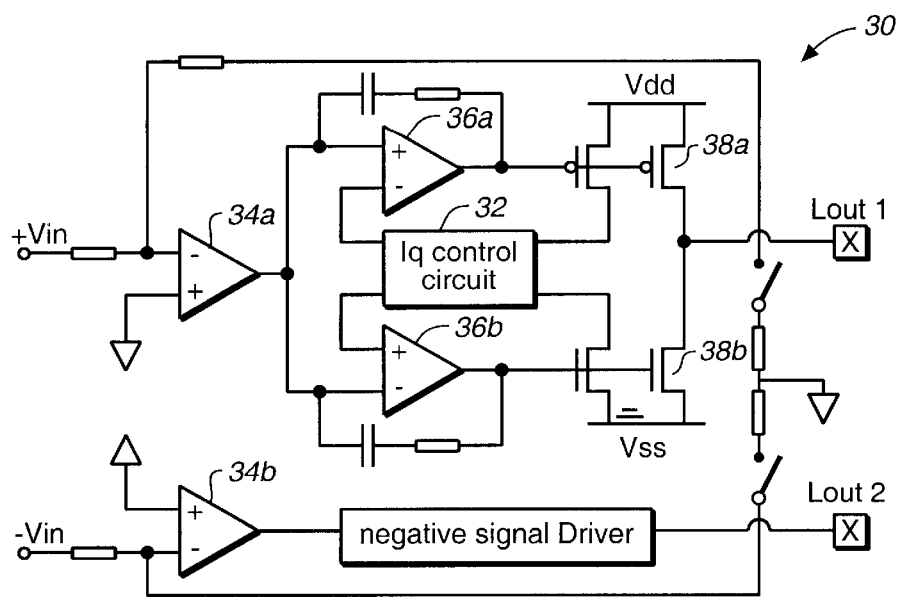
FIG._3A
*(PRIOR ART)*
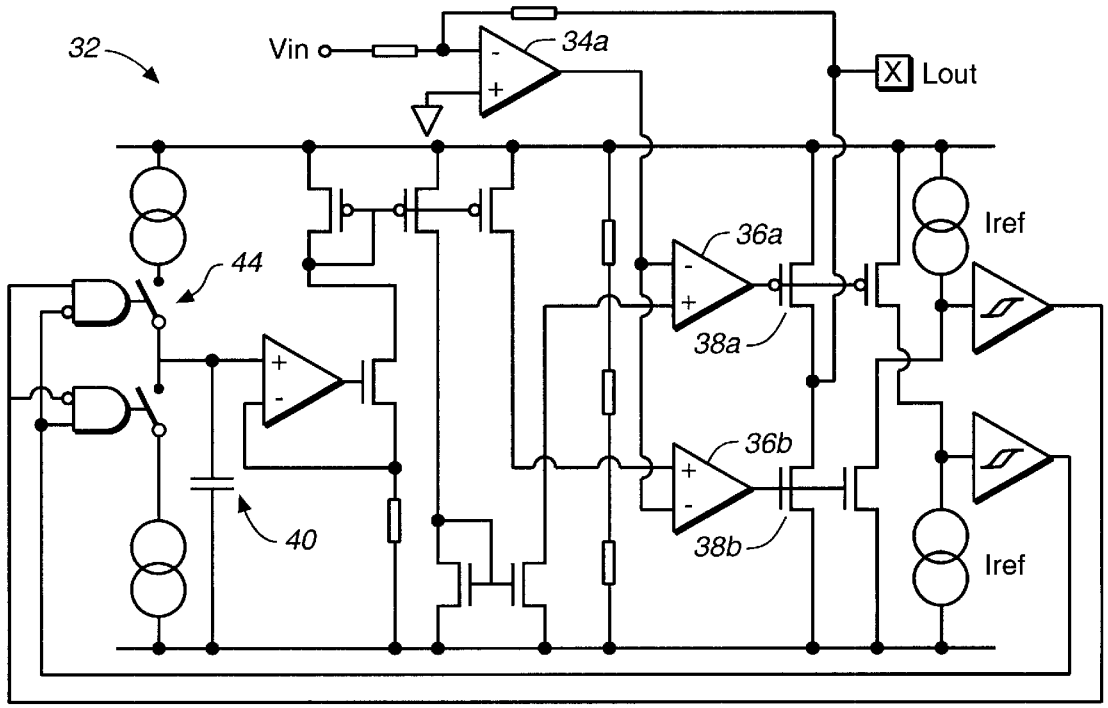
FIG._3B
*(PRIOR ART)*

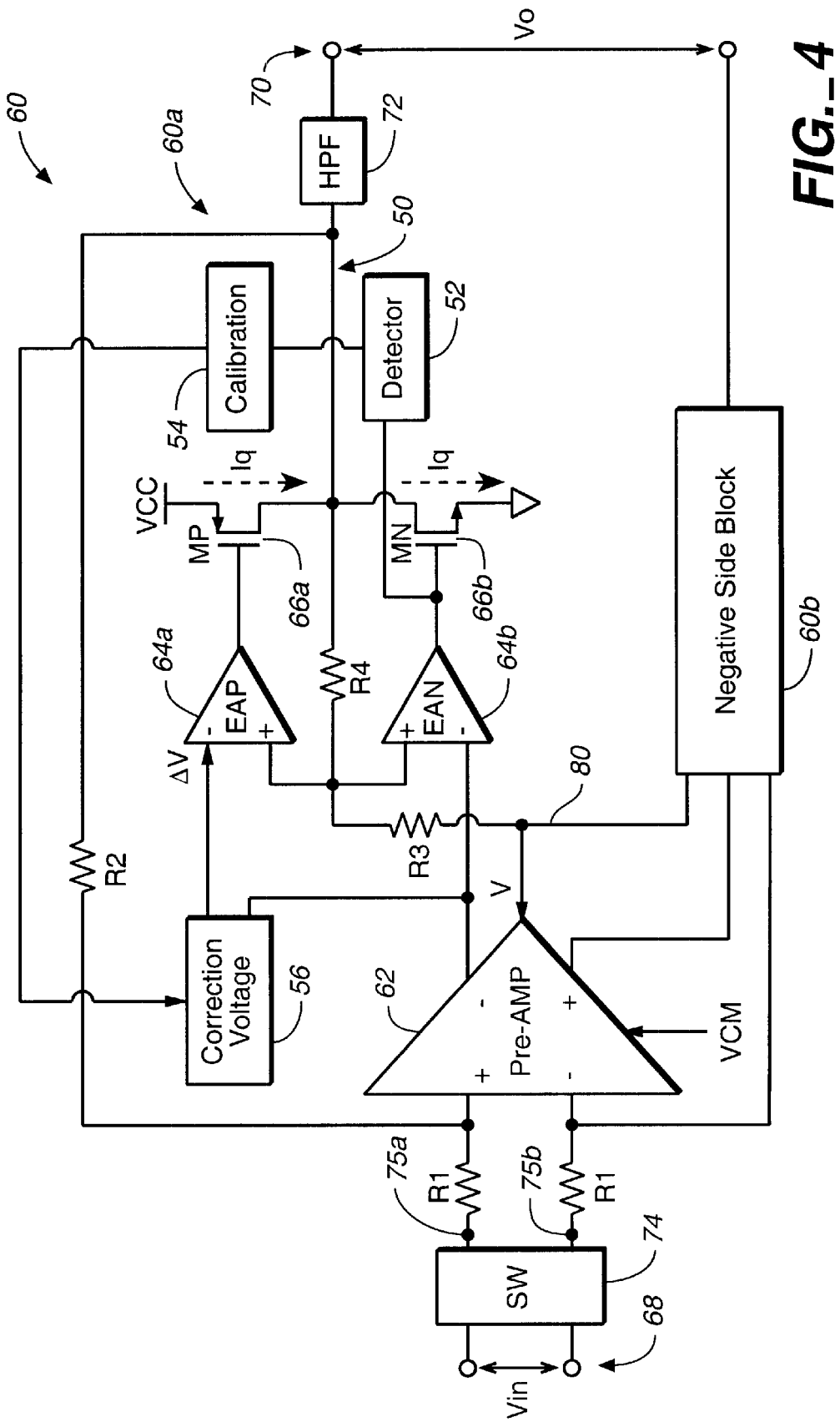
FIG._4

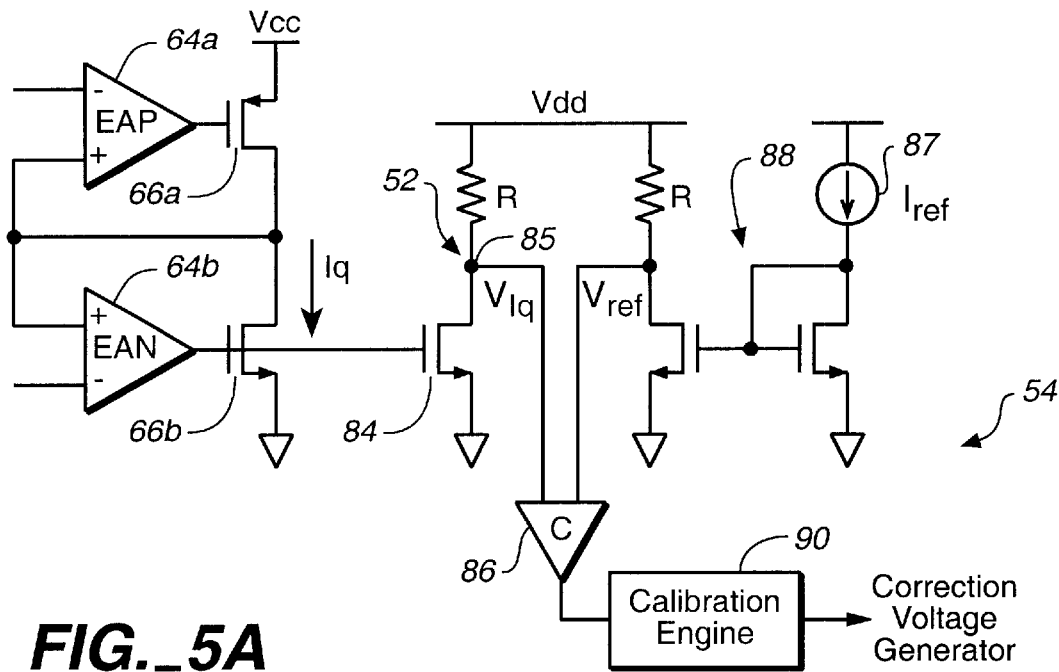
FIG._5A
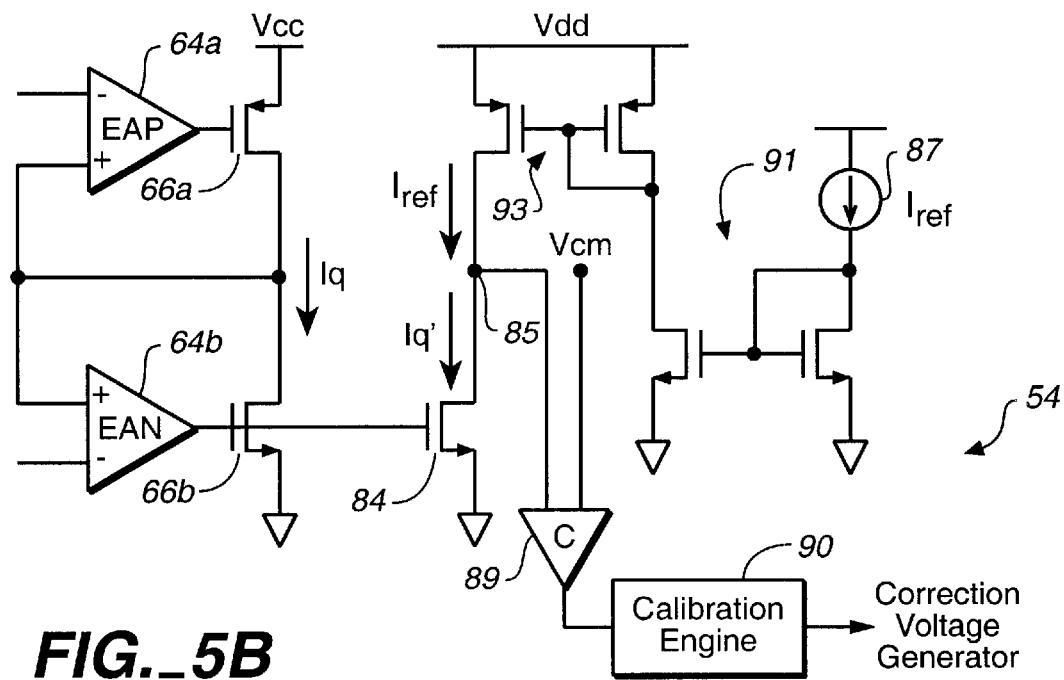
FIG._5B

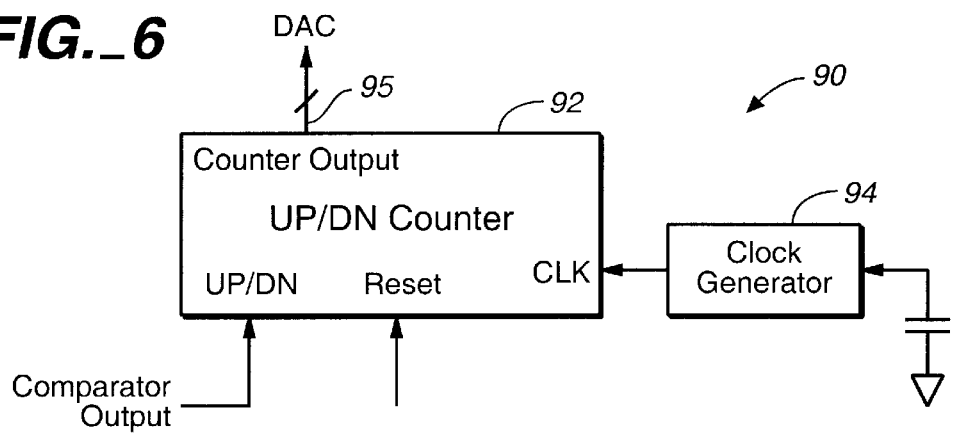
FIG._6
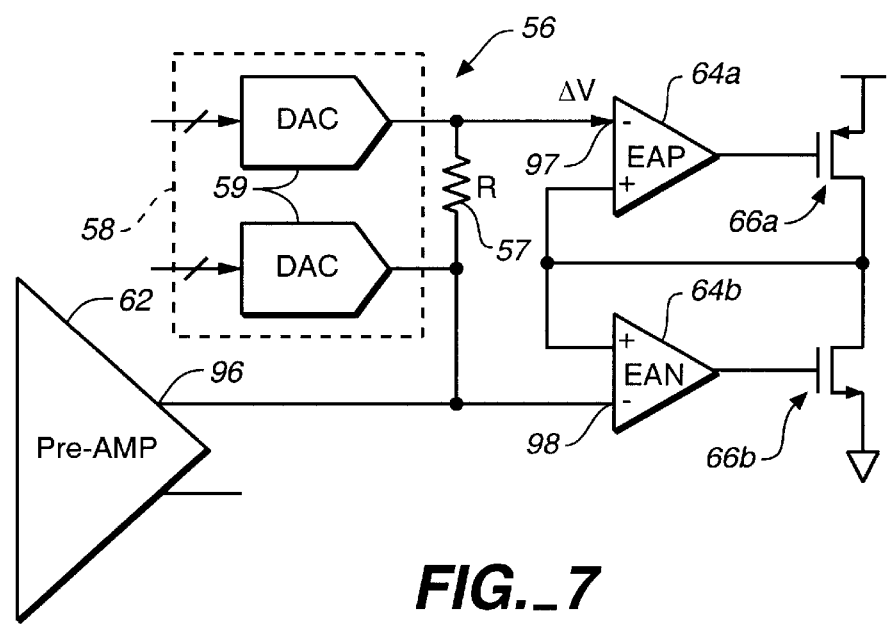
FIG._7
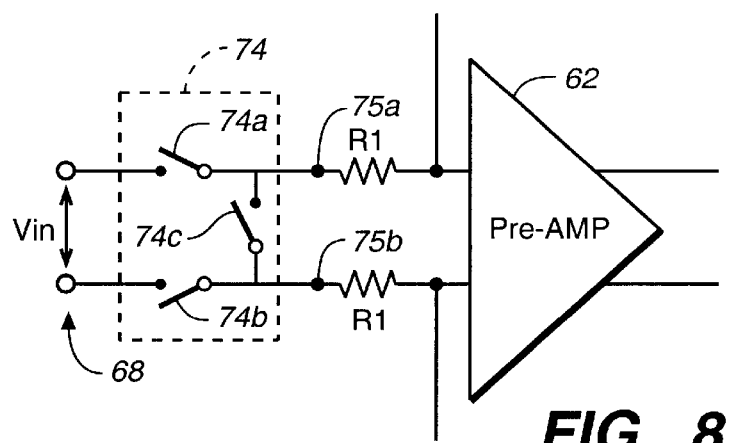
FIG._8

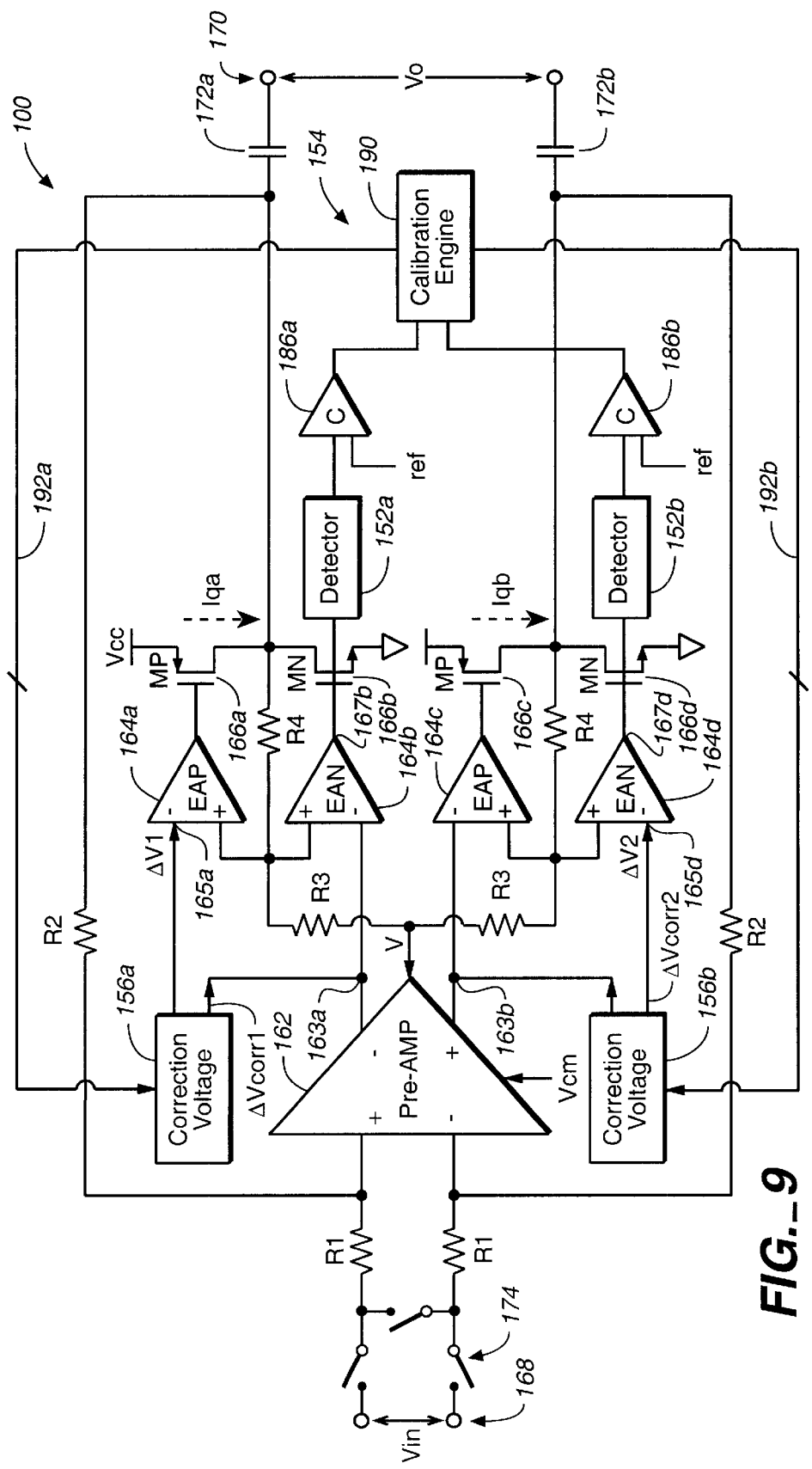
FIG._9

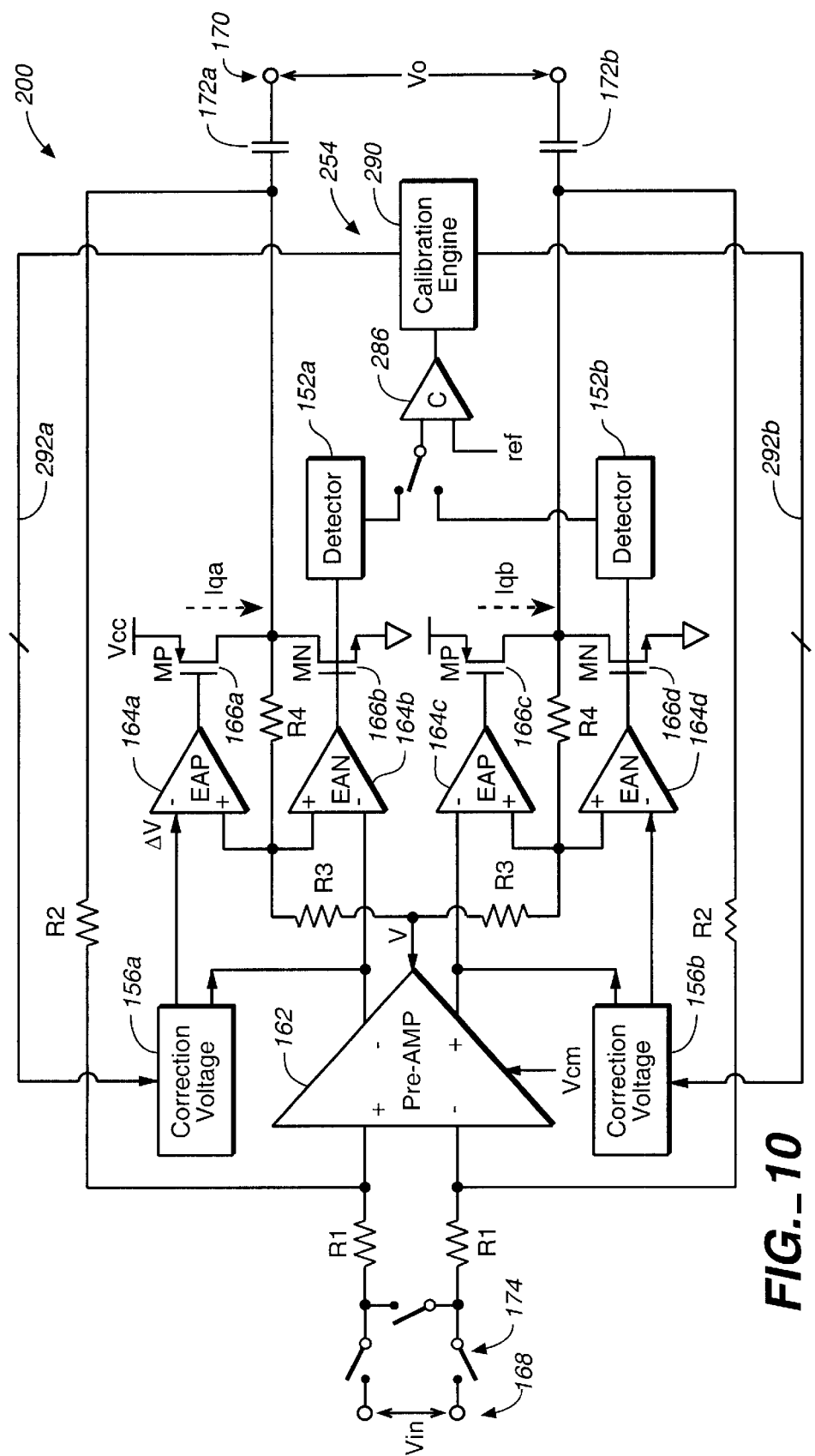
FIG._10

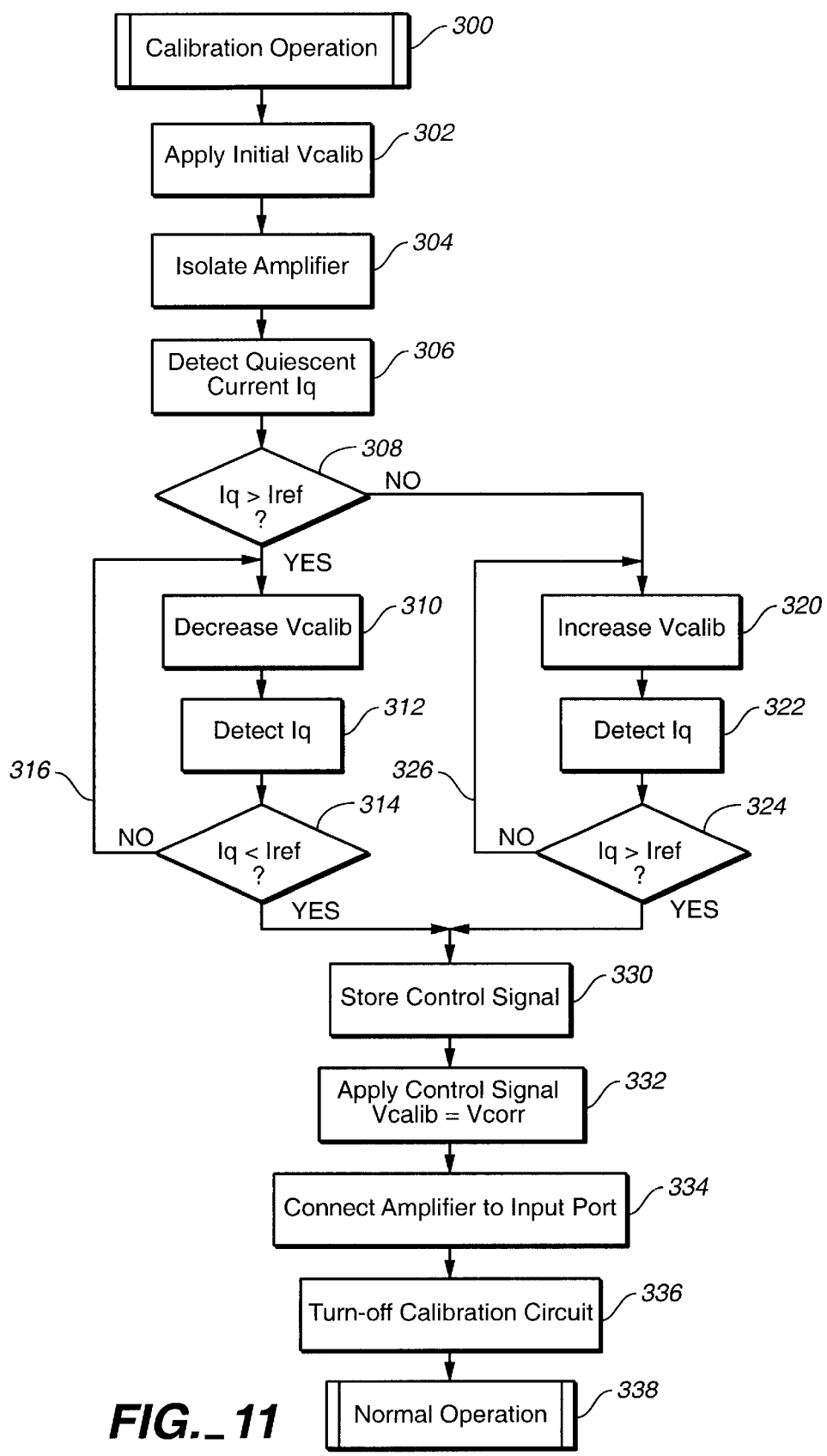
FIG._11

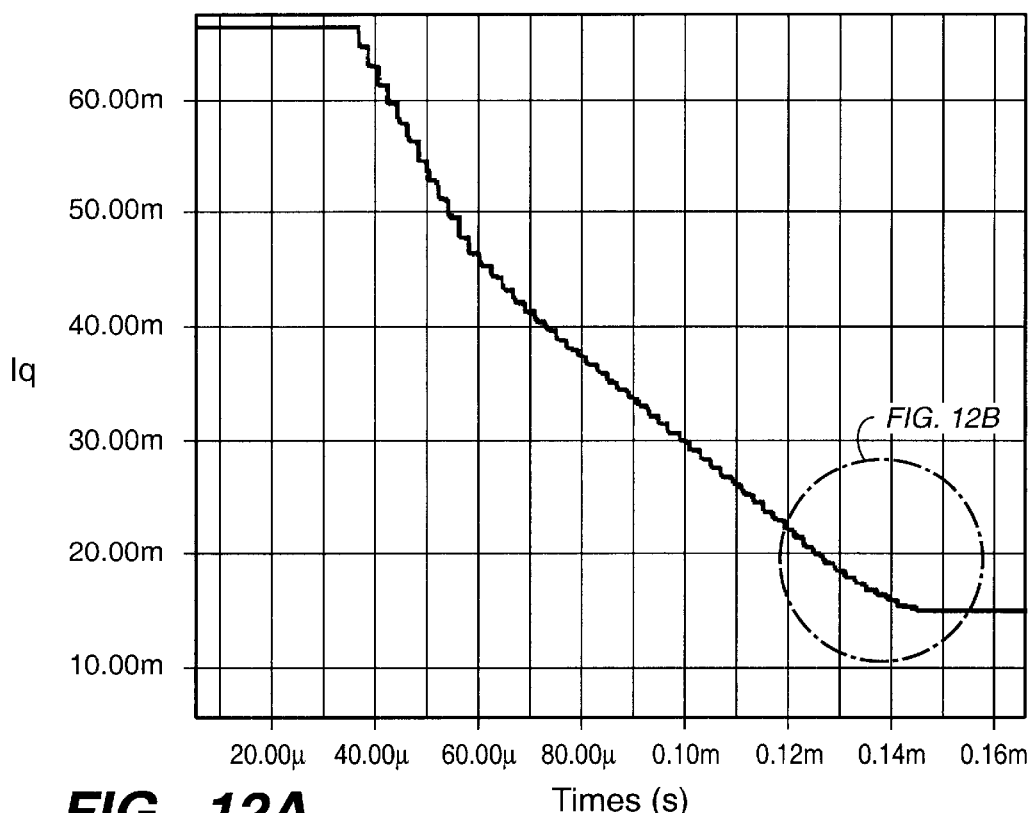
FIG._12A
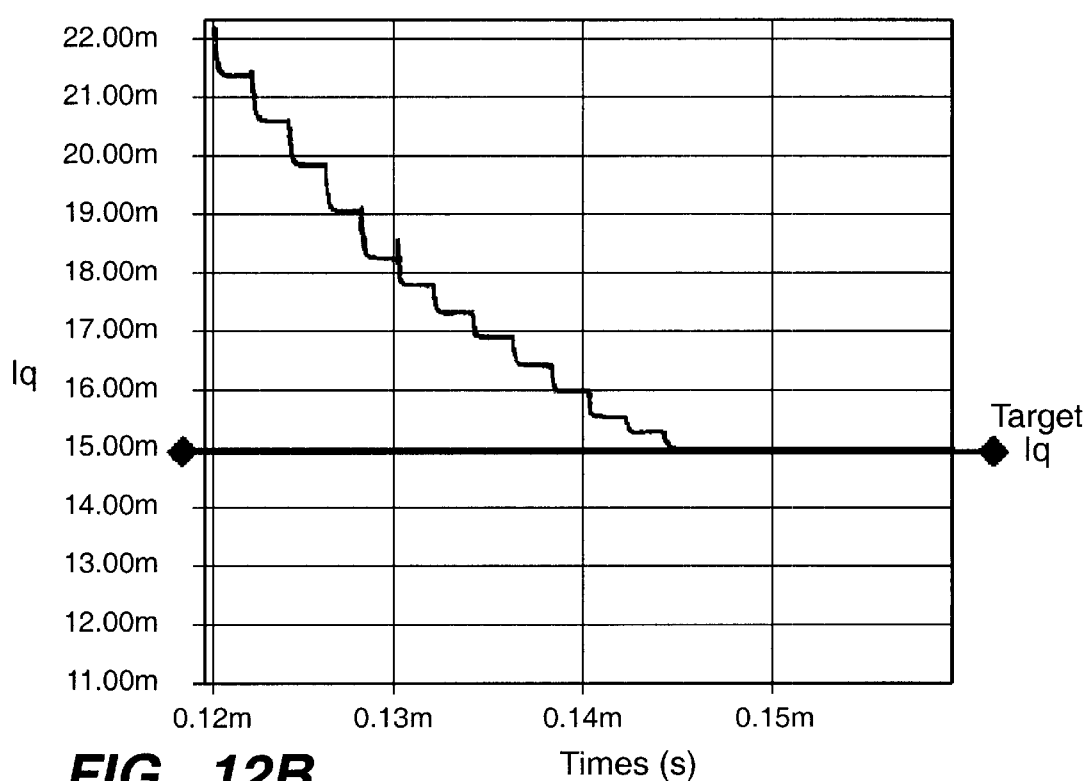
FIG._12B

METHOD AND CIRCUIT FOR CONTROLLING QUIESCENT CURRENT OF AMPLIFIER

PRIORITY CLAIM

This application claims the benefit of provisional U.S. patent application Ser. No. 60/338,811, filed on Dec. 7, 2001 in the names of the same inventors.

FIELD OF THE INVENTION

The present invention relates to broadband telecommunications. More particularly, the present invention relates to a Class-AB amplifier for a line driver in a broadband telecommunications system.

BACKGROUND OF THE INVENTION

FIG. 1 illustrates a typical circuit structure of a Class-AB amplifier 10 used for a line driver in broadband telecommunications such as digital subscriber line systems (xDSL). As shown in FIG. 1, the amplifier 10 is of an inverting-type and includes a pre-amplifier (pre-amp) 12, error amplifiers 14a, 14b, 15a, and 15b, and an output stage having large-sized output devices 16a, 16b, 18a, and 18b in a closed loop configuration. The output stage includes large complementary common source devices driven by the corresponding pair of the error amplifiers. An input signal ($V_{in}$) is amplified through these three stages and output as an output signal ($V_o$). Because of the push-pull nature of the Class-AB amplifier structure, both the error amplifiers 14b and 14b driving the n-channel output devices and the error amplifiers 14a and 15a driving the p-channel output devices are provided.

Linearity and power dissipation are key performance figures of a line driver. In a line driver employing a class AB amplifier, such as the line driver 10, the main source of the nonlinearity is distortion incurred by the output devices which experience the largest voltage swing in the circuit. To the first order, the closed-loop nonlinearity is determined by the output device distortion divided by an open loop gain:

$$HD_{Closedloop} \approx \frac{HD_{output-devices}}{A_{preamp} \times A_{EA} \times gm_{output-devices} \times RL} \quad (1)$$

where HD stands for the harmonic distortion, $A_{preamp}$ is a gain of the preamplifier, $A_{EA}$ is a gain of the error amplifier, $gm_{output-devices}$ is the transconductance of the output devices, and RL is an equivalent load impedance. In the case of the line driver for a transmission line (with a resistance $R_{line}$) coupled through a transformer having a turns ratio of n, the equivalent load impedance RL is $R_{line}/n^2$.

Accordingly, in order to effectively suppress the distortion caused by the output devices, a high open-loop gain (the denominator of Equation (1)) is desirable. The required open-loop gain depends on the level of nonlinearity generated by the output devices plus the additional nonlinearities produced by the preamplifier and the error amplifiers. To realize a large open loop gain, the gain of each amplifier stage in the signal path, i.e., the pre-amp gain, the error amplifier gain, and the gain from the output devices, are typically maximized as much as possible, while maintaining stability.

In a line-driver circuit employing class-AB output stage, a quiescent current in the output devices must be well controlled. The quiescent current is basically the operating supply current of the amplifiers, and is required to bias the internal circuitry (such as output devices) of the amplifiers regardless of existence of an input signal. Thus, the quiescent current adds to the power consumption of the amplifier, and designing for a very low quiescent current significantly reduces the power dissipation. On the other hand, however, in order to obtain a low distortion and/or high linearity performance of the amplifier, an additional biasing current (i.e., a larger quiescent current) is typically required. In such a case, if the quiescent current has a large variation, it degrades the linearity of the amplifier. A large quiescent current variation also results in excess power dissipation.

The primary source of a quiescent current variation is the input-referred offset voltage ($\Delta V$) of the error amplifiers. Since a quiescent current variation ($\Delta I_Q/I_Q$) is proportional to the offset voltage and the gain of the amplifier, the error amplifier gain cannot be made arbitrarily large. The offset of the error amplifier, which largely depends on the process and matching of transistors, is statistical in nature and considered random. Such a random offset of the error amplifier causes a random variation in an offset voltage ($\Delta V$).

FIG. 2A schematically illustrates a typical output stage 20 including a pair of error amplifiers 22a and 22b, a p-channel output device (MP) 24a, and an n-channel output device (MN) 24b. The input-referred offset voltage of the error amplifier 22a, which drives the output device 24a, is considered and modeled as a small voltage source ($V_{offset}$) at the input of the error amplifier 22a. The maximum quiescent current variation $\Delta I_Q/I_Q$ is estimated to be:

$$\frac{\Delta I_Q}{I_Q} \approx \frac{2V_{offset}A_{EAP}}{(V_{GS}-V_T)_{MP}} \quad (2)$$

where $A_{EAP}$ corresponds to the DC gain of the error amplifier 22a.

Assuming a maximum offset voltage ($V_{offsetmax}$) of the error amplifier 22a is about 3 mV, a gate overdrive voltage ($V_{GS}-V_T)_{MP}$ of the output device 24a is about 150 mV, and allowing a 40% fluctuation of the quiescent current ($\Delta I_Q/I_Q$), from expression (2), it is found that the open-loop gain (amplification factor) of the error amplifier must be constrained to about 8 to 10 or less. More detailed discussion in the context of an integrated services digital network (ISDN) application is found in "A CMOS Line Driver with 80-dB Linearity for ISDN Application," H. Khorramabadi., JSSC, vol. 27, no. 4, April 1992. Therefore, without controlling the quiescent current, the gain of the error amplifiers has to be limited to around 18 dB–20 dB due to a large quiescent current variation caused by a random offset voltage of the error amplifiers.

FIGS. 2B and 2C schematically illustrate the quiescent current (Iq) variations where an offset voltage of the error amplifiers has ±3 mV fluctuation. As shown in FIG. 2B, when the error amplifiers have a large amplification factor (high gain), the offset voltage creates a significant quiescent current variation. On the other hand, as shown in FIG. 2C, when the error amplifiers have a small amplification factor (low gain), the corresponding quiescent current variation is also small.

One approach to solve the offset problem of the error amplifier is to monitor the quiescent current and adjust the offset voltage using a quiescent control circuit in negative feedback configuration. For example, a quiescent control circuit for ISDN applications with moderate linearity level has been reported in "A 3.3 V, Low-Distortion ISDN Line Driver with a Novel Quiescent Current Control Circuit," H Casier, et al., JSSC vol. 33, No. 7, July 1998. FIG. 3A schematically illustrates an on-chip portion of the reported line driver 30 having a quiescent current control circuit 32. The line driver 30 includes the first stage amplifiers (pseudo-differential preamplifier) 34a and 34b, error amplifiers 36a and 36b, and output devices 38a and 38b.

FIG. 3B schematically illustrates the circuit structure of the quiescent current control circuit 32. According to this conventional approach, the gain of the error amplifiers can be increased higher than 20 dB without generating a large quiescent current variation. However, this method has several crucial disadvantages for use in the broadband communications where a much higher linearity and signal to noise ratio (SNR), a higher data rate, and a wider bandwidth are required.

First, since the quiescent current control (negative feedback) is performed using a control clock with a control frequency, the quiescent current control circuit 32 makes the DC wander having the control frequency. In order to reduce the DC wander effect, a large low pass filter (capacitor) 40 is required, as shown in FIG. 3B. This low-pass filtering to mask the control frequency also limits the available bandwidth for the data transmission. Second, since the quiescent current control employs a negative feedback loop 42, it may cause a stability problem and reduce the overall gain of the open loop signal gain. In addition, since the conventional quiescent control involves switching operation (with switches 44) during the normal operation of the line driver, it inherently introduces switching noises and/or cross-talk into the data signal processing. Thus, a careful circuit design and layout is required to prevent such switching noises. Furthermore, the conventional quiescent control block contributes to extra power dissipation, increasing the required power for the line driver operation.

Accordingly, it would be desirable to reduce the quiescent current variation due to amplifier offset while maintaining a sufficient bandwidth and good linearity of the overall amplifier without adding a complex control circuit, extra power dissipation; and/or introducing undesirable switching noises.

BRIEF DESCRIPTION OF THE INVENTION

A method and circuit control a quiescent current of an amplifier including a preamplifier, error amplifiers coupled to the preamplifier, and output devices driven by the error amplifiers, the error amplifiers having an input-referred offset voltage. The method includes (a) applying a calibration voltage to an input of the error amplifiers, (b) calibrating a quiescent current of the output devices by changing the calibration voltage so that the calibrated quiescent current has a predetermined current value, the calibration voltage corresponding to the calibrated quiescent current being set as a correction voltage, and (c) operating the amplifier with the correction voltage applied to the input of the error amplifiers. The quiescent control circuit includes a correction voltage generator coupled to an input of the error amplifies, the correction voltage generator supplying a correction voltage to the input, a quiescent current detector coupled to an output of the error amplifiers, the quiescent current detector detecting a quiescent current flowing through the output devices, and a calibration circuit coupled to the quiescent current detector and to the correction voltage generator, the calibration circuit adjusting the correction voltage so that the quiescent current is calibrated to a predetermined current value.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is an electrical block diagram schematically illustrating a typical circuit structure of a Class-AB amplifier used for a line driver.

FIG. 2A is an electrical diagram schematically illustrating a typical output stage including a pair of error amplifiers and output devices.

FIG. 2B is a diagram schematically illustrating an example of quiescent current variation when the error amplifiers have a high gain.

FIG. 2C is a diagram schematically illustrating an example of quiescent current variation when the error amplifiers have a low gain.

FIG. 3A is an electrical block diagram schematically illustrating an on-chip portion of a line driver having a conventional quiescent current control circuit.

FIG. 3B is an electrical block diagram schematically illustrating the circuit structure of the conventional quiescent current control circuit.

FIG. 4 is an electrical block diagram schematically illustrating an amplifier circuit including a quiescent current control circuit in accordance with one embodiment of the present invention.

FIG. 5A is an electrical block diagram schematically illustrating an example of the quiescent current detector and the calibration circuit in accordance with one embodiment of the present invention.

FIG. 5B is an electrical block diagram schematically illustrating another example of the quiescent current detector and the calibration circuit.

FIG. 6 is an electrical block diagram schematically illustrating an example of the calibration engine in accordance with one embodiment of the present invention.

FIG. 7 is an electrical block diagram schematically illustrating an example of the correction voltage generator in accordance with one embodiment of the present invention.

FIG. 8 is an electrical diagram schematically illustrating an example of the switching circuit in accordance with one embodiment of the present invention.

FIG. 9 is an electrical block diagram schematically illustrating an amplifier circuit having a controlled quiescent current in accordance with one embodiment of the present invention.

FIG. 10 is an electrical block diagram schematically illustrating an amplifier circuit having a controlled quiescent current in accordance with another embodiment of the present invention.

FIG. 11 is a process flow diagram schematically illustrating a method for controlling a quiescent current of an amplifier, in accordance with one embodiment of the present invention.

FIGS. 12A and 12B are diagrams illustrating an example of simulation result for the automatic offset calibration in accordance with one embodiment of the present invention.

DETAILED DESCRIPTION

Embodiments of the present invention are described herein in the context of a method and circuit for controlling a quiescent current of an amplifier. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 4 schematically illustrates a quiescent current control circuit 50 for an amplifier 60, in accordance with one embodiment of the present invention. The amplifier 60 includes a preamplifier 62, error amplifiers 64a and 64b coupled to the preamplifier 62, and output devices 66a and 66b driven by the error amplifiers 64a and 64b. The error amplifiers 64a and 64b have an input-referred offset voltage $\Delta V$. The quiescent control circuit 50 includes a quiescent current detector 52, a calibration circuit 54, and a correction voltage generator 56.

The amplifier 60 also includes an input port 68 for receiving an input signal voltage $V_{in}$, a feedback loop with feedback resistance $R_2$, and an output port 70 for outputting an output signal voltage $V_o$ (through an optional high pass filter 72). The input signal $V_{in}$ is input to the preamplifier 62 through input resistors $R_1$ (and an optional switching circuit 74). As shown in FIG. 4, the amplifier 60 employs a differential structure having a class-AB type output stage, and is of an inverting type. However, the present invention is equally applicable to non-inverting type amplifiers. The differential structure of the amplifier 60 includes a common mode feedback scheme 80 which monitors and averages the differential output signal so as to stabilize the DC level of the output signal voltage $V_o$ (with a reference voltage $V_{CM}$). Although the differential structure of the amplifier 60 includes a positive side 60a (for an output signal) and a negative side 60b (for a complementary signal of the output signal), FIG. 4 only shows the detailed circuit structure of the positive side 60a.

If the input offset of the preamplifier 62 is small, the quiescent current $I_{qp}$ through the output device (MP) 66a and the quiescent current $I_{qn}$ through the output device (MN) 66b become very close to each other. The amplifier 60 may also use a high pass filter 72 in the output signal path to the output node 70 so that the quiescent current $I_{qp}$ is forced to be equal to the quiescent current $I_{qn}$. The high pass filter 72 may be an AC coupling (or DC blocking) capacitor. When the high pass filter 72 is employed, even if the input offset of the preamplifier 62 is not small, the quiescent currents $I_{qp}$ and $I_{qn}$ flowing through the two large output devices 66a and 66b can be forced to be substantially the same, provided that resistance $R_2$ (of a global feedback path) and resistance $R_4$ (of a local feedback path) are large enough to neglect the current through them.

When the quiescent currents through the output devices 66a and 66b can be made substantially equal, or the difference between them is negligible, only one of the output devices 66a and 66b can be selected to sample the quiescent current. This is preferable to simplify the quiescent current control circuit structure. Thus, in accordance with one embodiment of the present invention, the quiescent current detector 52 is coupled to an output of one of the error amplifiers (for example, the output of error amplifier 64b) and detects the quiescent current $I_{qn}$, which is substantially the same as the quiescent current $I_{qp}$. Alternatively, the quiescent current detector 52 may be coupled to an output of the error amplifier 64a so as to detect the quiescent current flowing through the output device 66a.

The correction voltage generator 56 is coupled to an input of one of the error amplifies, for example, the error amplifier 64a, and supplies a correction voltage to the input of the error amplifier 64a. The calibration circuit 54 is coupled to the quiescent current detector 52 and to the correction voltage generator 56, and adjusts the correction voltage so that the detected quiescent current $_{qn}$ ($\approx I_{qp} \equiv I_q$) is calibrated to a predetermined current value.

FIG. 5A schematically illustrates an example of the quiescent current detector 52 and the calibration circuit 54 in accordance with one embodiment of the present invention. As shown in FIG. 5A, the quiescent current detector 52 may include a replica 84 of the output device 66b. The calibration circuit 54 may include a comparator 86 and a calibration engine 90. The replica 84 is an output device (transistor) having a device ratio substantially smaller than that of the output device 66bs. For example, when the device ratio of the replica 84 is 1/100 of that of the output device 66b, a current of $I_q/100$ is detected at a node 85 (as a corresponding voltage $V_{Iq}=I_qR$). The detected current is input to an input of the comparator 86. The comparator also receives at another input a reference current (as a corresponding reference voltage $V_{ref}=I_{ref}R$). The reference current is provided by a reference current source 87 through a mirror circuit 88 which mimics the quiescent current detector 52. The reference current has a predetermined current value $I_{ref}$ which corresponds to the desired value of the quiescent current. The reference current is derived from a bandgap voltage of the devices, so that the controlled current is independent of process and temperature of the mirror circuit 88. The calibration engine 90 generates a control signal based on the output of the comparator 86 and the control signal is supplied to the correction voltage generator 56 (FIG. 4).

FIG. 5B schematically illustrates another example of the quiescent current detector 52 and the calibration circuit 54. Similarly to the previous example, the quiescent current detector 52 includes a replica 84 of the output device 66b, and the calibration circuit 54 includes a comparator 89 and a calibration engine 90. The like components bear the like numeral references as that in FIG. 5A. In this example, a reference current is provided by a reference current source 87 through a first mirror circuit 91 and a second mirror circuit 93 to a node 85. A first input of the comparator 89 is coupled to the node 85, and a second input of the comparator 89 is coupled to a reference voltage $V_{CM}$ which is the stabilized common mode voltage of the differential output voltage $V_o$ (see FIG. 4). If the quiescent current ($I_q'=I_q/n$) below the node 85 is smaller than the reference current ($I_{ref}$) above the node 85, the input to the comparator 89 is greater than the reference voltage $V_{CM}$. Here, 1/n is the ratio of the device ratio of the transistor 84 to that of the output device 66b. If the quiescent current ($I_q'$) is greater than the reference current ($I_{ref}$), the input to the comparator 89 is smaller than the reference voltage $V_{CM}$. In this manner the comparator 69 compares the detected quiescent current with the reference current, and outputs the corresponding signal to the calibration engine 90. The calibration engine 90 generates a control signal based on the output of the comparator 86 and the control signal is supplied to the correction voltage generator 56 (FIG. 4).

Typically, the calibration is performed during the power-up or initialization of the amplifier circuit, and the calibration circuit 54 may be turned off after the quiescent current $I_q$ is adjusted to the predetermined current value. Thus, the calibration process does not affect the normal operation of the amplifier, nor consumes additional power during the normal operation. FIG. 6 schematically illustrates an example of the calibration engine 90 in accordance with one embodiment of the present invention. As shown in FIG. 6, the calibration engine 90 includes an up-down counter 92 and a clock generator 94. The clock generator 94 supplies a clock signal for the calibration during the initialization or power up of the amplifier. Clocked with the clock signal, the up-down counter 92 generates a digital signal 95 (control signal) in accordance with the comparator output.

FIG. 7 schematically illustrates an example of the correction voltage generator 56 in accordance with one embodiment of the present invention. As shown in FIG. 7, the correction voltage generator 56 includes a resistor 57 and a current supply circuit 58 coupled to the resistor 57. The resistor 57 is provided between an output 96 of the preamplifier 62 and an input 97 of the error amplifier 64a, and the current supply circuit 58 supplies a correction current so as to generate the correction voltage across the resistor 57. The correction current can be supplied in either direction so as to adjust the offset voltage ΔV of the error amplifier 64b. It should be noted that, since the quiescent currents of the output devices 66a and 66b can be forced to be the same, the correction voltage generator 56 (resistor 57 and the current supply circuit 58) may be provided between the output 96 of the preamplifier 62 and the input 98 of the error amplifier 64b.

As shown in FIG. 7, the current supply circuit 58 may include a push-pull digital-analog converter (DAC) 59 which is controlled by the digital signal 95 (FIG. 6). For example, a specific digital value of the control signal corresponds to a specific mount of the current supplied from the DAC 59. By employing the push-pull dual structure, the correction voltage can be prevented from affecting the preamplifier output. Once the quiescent current is calibrated to the predetermined value (target quiescent current), the DAC 59 is set so as to provide the corresponding correction current during the normal operation of the amplifier. A register or any memory device (not shown) may be used to set the DAC 59.

Referring back to FIG. 4, in accordance with one embodiment of the present invention, the amplifier circuit 60 further includes a switching circuit 74 coupled between the input signal port 68 and the preamplifier 62. During calibration, the switching circuit 74 electrically disconnects differential inputs 75a and 75b of the preamplifier 62 from the input port 68, and electrically connects the differential inputs 75a and 75b each other. FIG. 8 schematically illustrates an example of the switching circuit 74 which employs three switching devices (such as transistors) 74a, 74b, and 74c. The switching devices 74a and 74b electrically disconnect the amplifier circuit from the input port 68, and the switching device 74c short-circuits the differential inputs 75a and 75b to each other so that the quiescent current is not affected by any input signal or noise.

FIG. 9 schematically illustrates an amplifier circuit 100 having a controlled quiescent current in accordance with one embodiment of the present invention. In FIG. 9, the negative side structure of the amplifier circuit 100 is explicitly depicted. As shown in FIG. 9, the amplifier circuit 100 includes an input port 168 for receiving an input signal ($V_{in}$), an output port 170 for outputting an output signal ($V_o$), a preamplifier 162 coupled to the input port 168 (through an optional switching circuit 174), a first pair of error amplifiers 164a and 164b coupled to a first output 163a of the preamplifier 162, first output devices 166a and 166b coupled between the first pair of error amplifiers 164a and 164b and the output port 170, a second pair of error amplifiers 164c and 164d coupled to a second output 163b of the preamplifier 162, and second output devices 166c and 166d coupled between the second pair of error amplifiers 164c and 164d and the output port 170. The first pair of error amplifiers 164a and 164b has a first input-referred offset voltage ($\Delta V_1$) and the second pair of error amplifiers 164c and 164d have a second input-referred offset voltage ($\Delta V_2$). The amplifier circuit 100 may also include a high pass filter 172 (typically AC coupling capacitors 172a and 172b) in the output signal path to the output node 170 so that the quiescent currents of the two output devices are forced to be the same.

The amplifier circuit 100 further includes a first correction voltage generator 156a coupled between an input of the first pair of error amplifies 164a and 164b (in this example, the input 165a of the error amplifier 164a) and the first output 163a of the preamplifier 162, a first quiescent current detector 152a coupled to an output of the first pair of error amplifiers 164a and 164b (in this example, an output 167b of the error amplifier 164b), a second correction voltage generator 156b coupled between an input of the second pair of error amplifies 164c and 164d (in this example, the input 165d of the error amplifier 164d) and the second output 163b of the preamplifier 162, a second quiescent current detector 152b coupled to an output of the second pair of error amplifiers 164c and 164d (in this example, an output 167d of the error amplifier 164d), and a calibration circuit 154 coupled to the first and second quiescent current detectors 152a and 152b and to the first and second correction voltage generators 156a and 156b.

Similarly to the previous embodiment, the first correction voltage generator 156a supplies a first correction voltage ($\Delta V_{corr1}$) to the input 165a of the error amplifier 164a, and the second correction voltage generator 156b supplies a second correction voltage ($\Delta V_{corr2}$) to the input 165d of the error amplifier 164d. The first quiescent current detector 152a detects a first quiescent current $I_{qa}$ flowing through the first output devices 166a and 166b, and the second quiescent current detector 152b detects a second quiescent current $I_{qb}$ flowing through the second output devices 166c and 166d. The calibration circuit 154 adjusts the first and second correction voltage so that the first and second quiescent currents $I_{qa}$ and $I_{qb}$ are calibrated to a predetermined current value.

As shown in FIG. 9, the calibration circuit 154 includes a first comparator 186a, a second comparator 186b, and a calibration engine 190. An input of the first comparator 186a is coupled to the first quiescent current detector 152a, and the other input of the first comparator 186a is coupled to a reference current corresponding to the predetermined current value of the first quiescent current $I_{qa}$. Similarly, an input of the second comparator 186b is coupled to the second quiescent current detector 152b, and the other input of the second comparator 186b is coupled to a reference current corresponding to the predetermined current value of the second quiescent current $I_{qb}$. The calibration engine 190 is coupled to the first comparator 186a and the second comparator 186b, and generates a first control signal 192a based on the output of the first comparator 186a, and a second control signal 192b based on the output of the second comparator 186b. The first and second control signals 192a and 192b are supplied to the first and second correction voltage generators 156a and 156b, respectively.

The calibration engine 190 may have a circuit structure similar to that of the calibration engine 90 shown in FIG. 6. According to this embodiment, since a comparator is provided to each quiescent current detector, the calibration engine 190, which is capable of parallel signal processing, can generate the first and second control signals 192a and 192b at the same time. Thus, the offset voltages of the first and second pairs of error amplifiers are calibrated concurrently during initialization (or power-up time) of the amplifier circuit 100. The calibration circuit 154 is turned off after the first and second quiescent currents are adjusted to the predetermined current value and the corresponding control signals 192a and 192b are stored in a digital memory (not shown in FIG. 9). The correction voltage generators 156a and 156b supply the correction voltages corresponding to the stored control signal values during the normal operation of the amplifier circuit 100.

FIG. 10 schematically illustrates an amplifier circuit 200 in accordance with another embodiment of the present invention. The like components bear the like numeral references as that of the amplifier circuit 100 of the previous embodiment. The amplifier circuit 200 includes a calibration circuit 254 instead of the calibration circuit 154 employed in the amplifier circuit 100. As shown in FIG. 10, the calibration circuit 254 includes a comparator 286 and a calibration engine 290. An input of the comparator 286 is switchably coupled to the first quiescent current detector 152a and the second quiescent current detector 152b. The other input of the comparator 286 is coupled to a reference current corresponding to the predetermined current value of the quiescent current.

The switchable input of the comparator 286 is first electrically connected, for example, to the first quiescent current detector 152a, during which the calibration engine 290 generates a first control signal 292a for the first correction voltage generator 156a. When calibrating the quiescent current $I_{qa}$ finishes, the comparator 286 is switched to the second quiescent current detector 152b, and the calibration engine 290 generates a second control signal 292b for the second correction voltage generator 156b. That is, the calibration engine 290 generates the first and second control signals 292a and 292b sequentially during calibration process.

Once the first and second quiescent currents are adjusted to the predetermined current value, the first and second control signals 292a and 292b are stored in a digital memory (not shown in FIG. 10). Such a digital memory may be provided either in the calibration engine 290 or in the correction voltage generators 256a and 256b. Then the calibration circuit 254 is turned off. The correction voltage generators 256a and 256b supply the correction voltages corresponding to the stored control signal values during the normal operation of the amplifier circuit 200. The calibration circuit 254 has a simplified circuit structure compared with the calibration circuit 154 of the previous example. However, the calibration time will be longer than that of the calibration circuit 154.

FIG. 11 schematically illustrates a method for controlling a quiescent current of an amplifier, in accordance with one embodiment of the present invention. The amplifier includes a preamplifier, error amplifiers coupled to the preamplifier, and output devices driven by the error amplifiers. The error amplifiers have an input-referred offset voltage. Typically, calibration of the amplifier is performed at initialization or power-up of the amplifier circuit. In the calibration operation (300), an initial calibration voltage ($V_{calb}$) is applied to an input of the error amplifiers (302). In order to avoid undesirable effect from input signal and/or input noise, the differential inputs of the amplifier circuit are electrically disconnected from a signal input port, and the differential inputs are short-circuited to each other (304). This electrical isolation of the signal path is maintained during calibration of the amplifier.

In the calibration operation, a quiescent current ($I_q$) of the output devices is calibrated by changing the calibration voltage so that the calibrated quiescent current has a predetermined current value. The quiescent current $I_q$ of an output device is detected (306), and the detected quiescent current $I_q$ is compared with a reference current $I_{ref}$ having the predetermined current value (308). A control signal is generated based on a result of the comparison, and the calibration voltage is changed in accordance with the control signal. In accordance with one embodiment of the present invention, a replica of the output device may be used to sample the quiescent current of the output device, and a comparator then compares it with the reference current so as to generate a digital signal as a control signal. The calibration voltage may be controlled by a current control DAC, preferably, a push-pull current DAC. The DAC output is applied to an on-chip resistor to generate the calibration voltage. The detecting, comparing, generating the control signal, and changing the calibration voltage are repeated until the quiescent current substantially equals the reference current.

For example, if the quiescent current $I_q$ is greater than the reference current $I_{ref}$, the calibration voltage $V_{calib}$ is decreased using the control signal (310). Then the quiescent current $I_q$ is detected again (312), and is compared with the reference current $I_{ref}$ (314). If the quiescent current $I_q$ is not smaller than the reference current $I_{ref}$ (316), the calibration voltage $V_{calib}$ is further decreased (310). The decreasing (310), detecting (312), and comparing (314) steps are repeated until the quiescent current $I_q$ becomes smaller than the reference current $I_{ref}$. On the other had, if the quiescent current $I_q$ is equal to or smaller than the reference current $I_{ref}$ at the initial detection (308), the calibration voltage $V_{calib}$ is increased using the corresponding control signal (320). The quiescent current $I_q$ is detected again (322), and is compared with the reference current $I_{ref}$ (324). If the quiescent current $I_q$ is not greater than the reference current $I_{ref}$ (326), the calibration voltage $V_{calib}$ is further increased (320). The increasing (320), detecting (322), and comparing (324) steps are repeated until the quiescent current $I_q$ becomes greater than the reference current $I_{ref}$. This calibration procedure adjusts the quiescent current $I_q$ to the reference current $I_{ref}$ (i.e., the target quiescent current value) within a certain small amount of difference $\Delta I$. The procedure may be clocked using a temporary clock signal available during the initialization or power-up time of the amplifier. This offset voltage calibration algorithm controls the quiescent current of the output device precisely as set by the reference current.

Once the quiescent current $I_q$ is calibrated to the reference current $I_{ref}$ ($\pm \Delta I$), the control signal giving that target quiescent current value is stored, for example, in a digital memory (330). The stored control signal is applied to the correction voltage generator and the calibration voltage $V_{calib}$ is set as the correction voltage $V_{corr}$ (332). The correction voltage is used during the normal operation the amplifier. The amplifier is electrically connected to the input port (334), and the calibration circuit is turned off (336). Then, the normal operation of the amplifier is started (338).

When the output devices includes a first pair of output devices for an output signal and a second pair of output devices for a complementary signal, the calibration operation may be performed concurrently for the first pair and the second pair in order to save the calibration/initialization time. Alternatively, the calibrating operation may be performed sequentially for the first pair of output devices and then the second pair of output devices in order to save hardware for the calibration circuit.

FIG. 12A illustrates an example of simulation result for the automatic offset calibration when an offset voltage of +10 mV is introduced to an error amplifier on purpose. An 8-bit push-pull offset current DAC, such as shown in FIG. 7, is used in this example. The reference current (i.e., the target quiescent current) is set to 15 mA. FIG. 12B shows an enlarged view of the circled portion 110 of the FIG. 12A. The result shows that the offset calibration algorithm is effective in reducing the quiescent current within 1-bit resolution of the offset current DAC.

By the offset voltage calibration procedure described above, the sampled quiescent current is adjusted to a predetermined current level. This allows to increase the error amplifier gain much larger than 20 dB, for example, to 40 dB, and thus to increase the overall open loop gain of the amplifier. Accordingly, the linearity of the amplifier is greatly improved over the conventional scheme employing a limited error amplifier gain (e.g., 20 dB) without causing undesirable effect due to the quiescent current variation. There is no extra power dissipation by the calibration scheme during the amplifier's normal operation since the calibration circuit is turned off after calibration. The present invention typically applies to amplifiers used for broadband communications, such as xDSL. However, the present invention is also applicable to any amplifiers of Class AB type.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the, spirit of the appended claims.

What is claimed is:

1. A method for controlling a quiescent current of an amplifier, the amplifier including a preamplifier, error amplifiers coupled to the preamplifier, and output devices driven by the error amplifiers, the error amplifiers having an input-referred offset voltage, said method comprising:

applying a calibration voltage to an input of the error amplifiers;

calibrating a quiescent current of the output devices by changing the calibration voltage so that the calibrated quiescent current has a predetermined current value, the calibration voltage corresponding to the calibrated quiescent current being set as a correction voltage;

electrically disconnecting differential inputs of the amplifier from a signal input port and short-circuiting the differential inputs during said applying and said calibrating; and operating the amplifier with the correction voltage applied to the input of the error amplifiers.

2. A method according to claim 1 wherein said applying and said calibrating are performed during initialization of the amplifier.

3. A method according to claim 1 wherein said calibrating includes:

detecting the quiescent current;

comparing the detected quiescent current with a reference current having the predetermined current value;

generating a control signal based on a result of said comparing;

changing the calibration voltage in accordance with the control signal; and repeating said detecting, comparing, generating, and changing until the quiescent current substantially equals the reference current.

4. A method according to claim 1 wherein the output devices includes a pair of first output devices for an output signal and a pair of second output devices for a complementary signal, said applying and said calibrating are performed concurrently for the first output devices and the second output devices.

5. A method according to claim 1 wherein the output devices includes a pair of first output devices for an output signal and a pair of second output devices for a complementary signal, said applying and said calibrating are performed sequentially for the first output devices and the second output devices.

6. A circuit for controlling a quiescent current of an amplifier, the amplifier including a preamplifier, error amplifiers coupled to the preamplifier, and output devices driven by the error amplifiers, the error amplifiers having an input-referred offset voltage, said circuit comprising:

a correction voltage generator coupled to an input of the error amplifiers, said correction voltage generator supplying a correction voltage to the input;

a quiescent current detector coupled to an output of the error amplifiers, said quiescent current detector detecting a quiescent current flowing through the output devices;

a calibration circuit coupled to said quiescent current detector and to said correction voltage generator, said calibration circuit adjusting the correction voltage so that the quiescent current is calibrated to a predetermined current value; and a switching circuit coupled between said preamplifier and a signal input port, said switching circuit electrically disconnecting differential inputs of said preamplifier from the signal input port and electrically connecting the differential inputs when said quiescent current detector and said calibration circuit are operating.

7. A circuit according to claim 6 wherein said calibration circuit is turned off after the quiescent current is calibrated to the predetermined current value.

8. A circuit according to claim 6 wherein said correction voltage generator includes:

a resistor coupled to the input of the error amplifiers; and a current supply circuit for supplying a current to said resistor so as to provide the correction voltage across said resistor.

9. A circuit according to claim 8 wherein said current supply circuit includes a push-pull digital-analog converter.

10. A circuit according to claim 6 wherein said quiescent current detector includes a replica of the output devices, said replica having a device ratio substantially smaller than that of the output devices.

11. A circuit according to claim 6 wherein said calibration circuit includes:

a comparator having a first input and a second input, the first input being coupled to said quiescent current detector, the second input being coupled to a reference current corresponding to the predetermined current value; and a calibration engine coupled to an output of said comparator, said calibration engine generating a control signal based on the output of said comparator, the control signal being supplied to said correction voltage generator.

12. A circuit according to claim 11 wherein said correction voltage generator includes:

a resistor coupled to the input of the error amplifiers; and a current supply circuit for supplying a current to said resistor so as to provide the correction voltage across said resistor.

13. A circuit according to claim 12 wherein said current supply circuit includes a push-pull digital-analog converter.

14. A circuit according to claim 12 wherein said control signal is a digital signal.

15. An amplifier circuit having a controlled quiescent current, said amplifier circuit comprising:

an input port for receiving an input signal;

an output port for outputting an output signal;

a preamplifier coupled to said input port;

error amplifiers coupled to said preamplifier, said error amplifiers having an input-referred offset voltage;

output devices coupled between said error amplifiers and said output port;

a correction voltage generator coupled to an input of said error amplifies, said correction voltage generator supplying a correction voltage to the input;

a quiescent current detector coupled to an output of said error amplifiers, said quiescent current detector detecting a quiescent current flowing through said output devices;

a calibration circuit coupled to said quiescent current detector and to said correction voltage generator, said calibration circuit adjusting the correction voltage so that the quiescent current is calibrated to a predetermined current value; and a switching circuit coupled between said input signal port and said preamplifier, said switching circuit electrically disconnecting differential inputs of said preamplifier from said input port and electrically connecting the differential inputs when said quiescent current detector and said calibration circuit are operating.

16. An amplifier circuit according to claim 15, wherein said calibration circuit is turned off after the quiescent current is adjusted to the predetermined current value.

17. An amplifier circuit according to claim 15 wherein said correction voltage generator includes:

a resistance coupled between an output of said preamplifier and the input of the error amplifiers; and a current supply circuit coupled to said resistance, said current supply circuit providing the correction voltage across said resistance.

18. An amplifier circuit according to claim 17 wherein said current supply circuit includes:

a push-pull digital-analog converter.

19. An amplifier circuit according to claim 15 wherein said quiescent current detector includes:

a replica of the output devices, said replica having a device ratio substantially smaller than that of the output devices.

20. An amplifier circuit according to claim 15 wherein said calibration circuit includes:

a comparator having a first input and a second input, the first input being coupled to said quiescent current detector, the second input being coupled to a reference current corresponding to the predetermined current value; and a calibration engine coupled to an output of said comparator, said calibration engine generating a control signal based on the output of said comparator, the control signal being supplied to said correction voltage generator.

21. An amplifier circuit according to claim 20 wherein said correction voltage generator includes:

a resistor coupled to the input of the error amplifiers; and a current supply circuit for supplying a current to said resistor so as to provide the correction voltage across said resistor.

22. An amplifier circuit according to claim 21 wherein said current supply circuit includes a push-pull digital-analog converter.

23. An amplifier circuit according to claim 20 wherein said control signal is a digital signal.

24. An amplifier circuit according to claim 15, further comprising:

a high pass filter coupled between an output of said output devices and the output port.

25. An amplifier circuit according to claim 24 wherein said high pass filter includes an AC coupling capacitor.

26. A amplifier circuit having a controlled quiescent current, said amplifier circuit comprising:

an input port for receiving an input signal;

an output port for outputting an output signal;

a preamplifier coupled to said input port;

a first pair of error amplifiers coupled to a first output of said preamplifier, said first pair of error amplifiers having a first input-referred offset voltage;

first output devices coupled between said first pair of error amplifiers and said output port;

a first correction voltage generator coupled to an input of said first pair of error amplifies, said first correction voltage generator supplying a first correction voltage to the input;

a first quiescent current detector coupled to an output of said first pair of error amplifiers, said first quiescent current detector detecting a first quiescent current flowing through said first output devices;

a second pair of error amplifiers coupled to a second output of said preamplifier, said second pair of error amplifiers having a second input-referred offset voltage;

second output devices coupled between said second pair of error amplifiers and said output port;

a second correction voltage generator coupled to an input of said second pair of error amplifies, said second correction voltage generator supplying a second correction voltage to the input of said second pair of error amplifiers;

a second quiescent current detector coupled to an output of said second pair of error amplifiers, said second quiescent current detector detecting a second quiescent current flowing through said second output devices; and a calibration circuit coupled to said first and second quiescent current detectors and to said first and second correction voltage generators, said calibration circuit adjusting the first and second correction voltage so that the first and second quiescent currents are calibrated to a predetermined current value.

27. An amplifier circuit according to claim 26 wherein said calibration circuit includes:
   a first comparator having a first input and a second input, the first input being coupled to said first quiescent current detector, the second input being coupled to a reference current corresponding to the predetermined current value;
   a second comparator having a third input and a fourth input, the third input being coupled to said second quiescent current detector, the fourth input being coupled to a reference current corresponding to the predetermined current value; and
   a calibration engine coupled to said first comparator and said second comparator, said calibration engine generating a first control signal based on an output of said first comparator, and a second control signal based on an output of said second comparator, the first and second control signals being supplied to said first and second correction voltage generators, respectively.

28. An amplifier circuit according to claim 27 wherein said calibration engine generates said first and second control signals concurrently.

29. An amplifier circuit according to claim 27 wherein said calibration circuit is turned off after the first and second quiescent currents are adjusted to the predetermined current value.

30. An amplifier circuit according to claim 26 wherein said calibration circuit includes:
   a comparator having a first input and a second input, the first input being switchably coupled to said first quiescent current detector and said second quiescent current detector, the second input being coupled to a reference current corresponding to the predetermined current value; and
   a calibration engine coupled to an output of said comparator, said calibration engine generating a first control signal when said comparator is switched to said first quiescent current detector, and generating a second control signal when said comparator is switched to said second quiescent current detector, the first and second control signals being supplied to said first and second correction voltage generators, respectively.

31. An amplifier circuit according to claim 30 wherein said calibration engine generates said first and second control signals sequentially.

32. An amplifier circuit according to claim 30 wherein said calibration circuit is turned off after the first and second quiescent currents are adjusted to the predetermined current value.

33. An apparatus for controlling a quiescent current of an amplifier, the amplifier including a preamplifier, error amplifiers coupled to the preamplifier, and output devices driven by the error amplifiers, the error amplifiers having an input-referred offset voltage, said apparatus comprising:
   means for applying a calibration voltage to an input of the error amplifiers;
   means for calibrating a quiescent current of the output devices by changing the calibration voltage so that the calibrated quiescent current has a predetermined current value, the calibration voltage corresponding to the calibrated quiescent current being set as a correction voltage;
   means for applying the correction voltage to the input of the error amplifier during operation of the amplifier; and
   means for electrically disconnecting differential inputs of the amplifier from a signal input port and short-circuiting the differential inputs during said applying and said calibrating.

34. An apparatus according to claim 33, further comprising:
   means for turning off said means for calibrating after the correction voltage is set.

35. An apparatus according to claim 33, further comprising:
   means for turning off said means for calibrating during operation of the amplifier.

36. An apparatus according to claim 33 wherein said means for calibrating includes:
   means for detecting the quiescent current;
   means for comparing the detected quiescent current with a reference current having the predetermined current value;
   means for generating a control signal based on a result of said comparing;
   means for changing the calibration voltage in accordance with the control signal; and
   means for repeating said detecting, comparing, generating, and changing until the quiescent current substantially equals the reference current.

37. A method for controlling a quiescent current of an amplifier, the amplifier including a preamplifier, error amplifiers coupled to the preamplifier, and output devices driven by the error amplifiers, the error amplifiers having an input-referred offset voltage, said method comprising:
   applying a calibration voltage to an input of the error amplifiers;
   calibrating a quiescent current of the output devices, including:
      detecting the quiescent current;
      comparing the detected quiescent current with a reference current having the predetermined current value;
      generating a control signal based on a result of said comparing;
      changing the calibration voltage in accordance with the control signal;
      repeating said detecting, comparing, generating, and changing until the quiescent current substantially equals the reference current; and
      setting the calibration voltage corresponding to the calibrated quiescent current as a correction voltage; and
   operating the amplifier with the correction voltage applied to the input of the error amplifiers.

38. A circuit for controlling a quiescent current of an amplifier, the amplifier including a preamplifier, error amplifiers coupled to the preamplifier, and output devices driven by the error amplifiers, the error amplifiers having an input-referred offset voltage, said circuit comprising:
   a correction voltage generator coupled to an input of the error amplifiers, said correction voltage generator supplying a correction voltage to the input;
   a quiescent current detector coupled to an output of the error amplifiers, said quiescent current detector detecting a quiescent current flowing through the output devices; and
   a calibration circuit including:
      a comparator having a first input and a second input, the first input being coupled to said quiescent current detector, the second input being coupled to a reference current corresponding to the predetermined current value; and a calibration engine coupled to an output of said comparator, said calibration engine generating a control signal based on the output of said comparator, the control signal being supplied to said correction voltage generator.

39. An amplifier circuit having a controlled quiescent current, said amplifier circuit comprising:

an input port for receiving an input signal;

an output port for outputting an output signal;

a preamplifier coupled to said input port;

error amplifiers coupled to said preamplifier, said error amplifiers having an input-referred offset voltage;

output devices coupled between said error amplifiers and said output port;

a correction voltage generator coupled to an input of said error amplifies, said correction voltage generator supplying a correction voltage to the input;

a quiescent current detector coupled to an output of said error amplifiers, said quiescent current detector detecting a quiescent current flowing through said output devices; and a calibration circuit including:

a comparator having a first input and a second input, the first input being coupled to said quiescent current detector, the second input being coupled to a reference current corresponding to the predetermined current value; and a calibration engine coupled to an output of said comparator, said calibration engine generating a control signal based on the output of said comparator, the control signal being supplied to said correction voltage generator.

40. An apparatus for controlling a quiescent current of an amplifier, the amplifier including a preamplifier, error amplifiers coupled to the preamplifier, and output devices driven by the error amplifiers, the error amplifiers having an input-referred offset voltage, said apparatus comprising:

means for applying a calibration voltage to an input of the error amplifiers;

means for calibrating a quiescent current including:
means for detecting the quiescent current;
means for comparing the detected quiescent current with a reference current having the predetermined current value;
means for generating a control signal based on a result of said comparing;
means for changing the calibration voltage in accordance with the control signal;
means for repeating said detecting, comparing, generating, and changing until the quiescent current substantially equals the reference current; and
means for setting the calibration voltage corresponding to the calibrated quiescent current as a correction voltage; and means for applying the correction voltage to the input of the error amplifier during operation of the amplifier.

* * * * *